INVENTOR
Arthur D. Delagrange
BY J. O. Tresansky
ATTORNEY
Charles L. Whitham
AGENT INVENTOR
Arthur D. Delagrange
BY J. O. Tresansky
ATTORNEY
Charles L. Whitham
AGENT 3,436,672

HIGH INPUT IMPEDANCE AMPLIFIER CIRCUIT

Arthur D. Delagrange, Silver Spring, Md., assignor to the United States of America as represented by the Secretary of the Navy Filed Mar. 8, 1966, Ser. No. 534,978
Int. Cl. H03f 3/14
U.S. Cl. 330—38 7 Claims

ABSTRACT OF THE DISCLOSURE

A high impedance amplifier circuit which uses as its input stage an insulated-gate, field-effect transistor as a source follower. A conventional emitter follower is cascaded with the insulated-gate, field effect transistor. Another conventional transistor is placed in the insulated-gate, field effect transistor's load circuit to serve as a constant-current source for providing a D.C. bias current thereto. One further conventional transistor is used to provide a D.C. bias current for the emitter follower. The amplifier circuit has unity gain, no phase inversion of the input signal and no D.C. offset.

The invention described herein may be manufactured and used by or for the Government of the United States of America for governmental purposes without the payment of any royalties thereon or therefor.

This invention relates generally to electronic amplifiers, and more particularly to a solid-state amplifier circuit having a high input impedance.

In electronic circuit design, buffer amplifiers are often required to provide signal source isolation and impedance matching between a signal source and its load. For example, in measuring circuits it is necessary to present a very high input impedance to the circuit being tested so as to not affect its performance. Special vacuum tube circuits have been used for similar purposes; however, vacuum tube circits are unacceptable in many applications because of power dissipation, size, sensitivity to shock, and need for maintenance. On the other hand, circuits employing conventional transistors cannot achieve a very high input impedance. Conventional field-effect transistors do offer a significant improvement, but they still have an undesirable input leakage current.

It is therefore an object of the instant invention to provide a high input impedance, solid-state amplifier circuit which is useful as a buffer amplifier between a high impedance signal source and a low impedance load.

It is another object of this invention to provide a solid-state amplifier having unity gain with no phase inversion or D.C. offset and which may be inserted as a buffer between parts of a system without appreciably affecting the signal.

It is a further object of the invention to provide a solid-state amplifier having a very high input impedance previously unobtainable with semiconductor circuitry and having convenience and reliability unobtainable with vacuum tube circuitry.

According to the present invention, the foregoing and other objects are attained by providing a circuit which uses as its input stage an insulated-gate, field-effect transistor as a source follower. This is cascaded with a conventional transistor connected as an emitter follower. The insulated-gate, field-effect transistor has an inherent input impedance of approximately $10^{15}$ ohms thus providing the very high input impedance of the circuit. As connected in the circuit, current through the device is a function of the voltage applied to the input gate analogous to a cathode follower in a vacuum tube. The conventional transistor connected as an emitter follower prevents the loading of the insulated-gate, field-effect transistor. The resulting circuit in addition to having a very high input impedance also provides high accuracy on the order of 0.1%.

The specific nature of the invention, as well as other objects, aspects, uses and advantages thereof, will clearly appear from the following description and from the accompanying drawing, in which.

Figure 1:
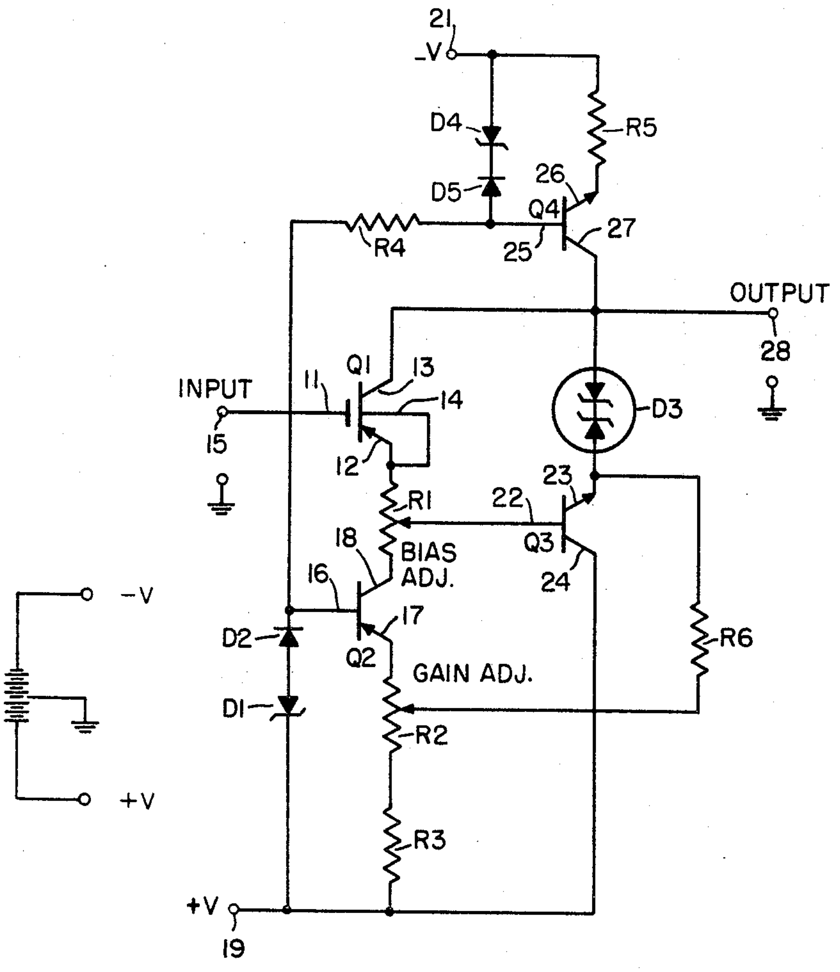
FIG. 1 is a schematic diagram of the solid-state amplifier circuit according to the invention.

Referring now to the drawing, and more particularly to FIG. 1 there is shown an insulated-gate, field-effect transistor Q1 having a gate electrode 11, a source electrode 12, a drain electrode 13, and a body electrode 14. Transistor Q1 may be, for example, a type 2N3608 manufactured by General Micro-electronics, Inc. The source electrode 12 and the body electrode 14 are connected together, and the gate electrode 11 is connected to an input terminal 15. Due to the relatively low transconductance of the insulated-gate transistor Q1, the circuit must be arranged so that the device operates essentially at constant voltage and current bias conditions. In this mode of operation the device is required to have high input impedance but not high gain. A conventional PNP transistor Q2 having a base electrode 16, an emitter electrode 17, and a collector electrode 18 is connected in the load circuit of transistor Q1 and acts as a constant-current source to provide D.C. bias current for transistor Q1 without low-impedance loading of signals. Collector electrode 18 of transistor Q2 is connected through the winding of potentiometer R1 to source electrode 12 of transistor Q1. Emitter electrode 17 of transistor Q2 is connected through the winding of potentiometer R2 and resistor R3 to a source of positive voltage at terminal 19. The winding of potentiometer R2 and resistance R3 establish the collector current for transistor Q2 and, therefore, the current through transistor Q1. Base electrode 16 of transistor Q2 is connected through forward-biased diode D2 and reverse-biased Zener diode D1 to the source of positive voltage at terminal 19. Diode D1 establishes a voltage regulated bias voltage for transistor Q2, while diode D2 compensates for the temperature drift of transistor Q2. Base electrode 16 of transistor Q2 is also connected through resistor R4 ultimately to a source of negative voltage at terminal 21. Resistor R4 establishes the current through Zener diode D1. Double-anode Zener diode D3 maintains a constant voltage across transistor Q1 irrespective of the input voltage. A double-anode diode is used for diode D3 so that the temperature drift of the diode will be balanced by the extra diode junction plus the emitter base junction of transistor Q3. An NPN transistor Q3 having a base electrode 22, an emitter electrode 23, and a collector electrode 24 is connected as an emitter follower so that only a small fraction of the current from transistor Q1 is diverted. Base electrode 22 is connected to the wiper of potentiometer R1, collector electrode 24 is connected to the source of positive voltage at terminal 19, and diode D3 is connected between emitter electrode 23 of transistor Q3 and drain electrode 13 of transistor Q1. Potentiometer R1 permits the adjustment of bias for transistor Q3 to thus compensate for the differences in control voltage of individual ones of transistor Q1. This bias adjustment permits adjustment of the circuit so that the D.C. voltage at the output is exactly the same as the D.C. voltage at the input. An NPN transistor Q4 having a base electrode 25, an emitter electrode 26, and a collector electrode 27 is connected in the load circuit of transistor Q3 to act as a constant-current source and provide D.C. bias current for transistor Q3 without low-impedance loading. The circuit including transistor Q4 is similar to the circuit including transistor Q2 and comprises a resistor R5 connected between the emitter electrode 26 and the source of negative voltage at terminal 21. Resistor R5 establishes the collector current of transistor Q4 and thus the current through transistor Q3. Base electrode 25 of transistor Q4 is connected through forward biased diode D5 and reverse biased Zener diode D4 to the source of negative voltage at terminal 21. Diode D4 establishes a voltage regulated bias voltage for transistor Q4, and diode D5 compensates for the temperature drift of transistor Q4. Base electrode 25 is also connected through resistor R4 ultimately to the source of positive voltage at terminal 19. Resistor R4 establishes the current through Zener diode D4 as it does for Zener diode D1. The collector electrode 27 of transistor Q4 is connected to the common junction of diode D3 and the drain electrode of transistor Q1 as is the ouptut terminal 28. Thus transistor Q4 shunts the high D.C. current through Zener diode D3 for low Zener impedance but presents only a high signal impedance load to the circuit. The bias point of transistor Q1 is chosen where the gate-to-source voltage approximately equals the drain-to-source voltage. This permits the output voltage of the circuit to be equal to the input voltage with no D.C. offset. When the output of the circuit is heavily loaded, the gain of the circuit tends to fall below unity but may be increased by a small amount of positive feedback at only a slight expense in linearity. This is provided by resistor R6 connected between the emitter electrode 23 of transistor Q3 to the wiper of potentiometer R2. Potentiometer R2 adjusts the gain by controlling the amount of feedback. In this manner, the circuit may be adjusted so that the output voltage is within 0.1% of the input under all conditions. Thus a linearity of at least 0.1% is guaranteed. Voltage regulation of diodes D1 and D4 and the constant current connection of transistors Q2, Q3 and Q4 make the circuit nearly independent of supply voltage variations. Output variations of about ±5 mv. have been measured for a ±1.0 volt variation of either the positive or negative voltage supplies. The temperature compensation afforded by diodes D1, D3 and D5 result in a temperature sensitivity for the circuit of ±1.0 mv. over a 50° C. temperature range.

Figure 2:
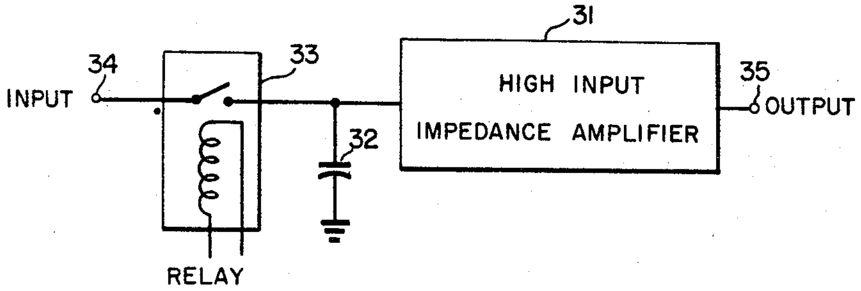
FIG. 2 is a partially schematic and partially block diagram illustrating the use of the invention in a sample-and-hold gate.

One use for the invention is as a sample-and-hold gate illustrated in FIG. 2. This comprises the high input impedance, solid-state amplifier 31 according to the invention having a storage capacitor 32 connected across its input. Capacitor 32 is connected through the switch contact of relay 33 to input terminal 34. When the relay contact closes due to the energization of the relay coil, capacitor 32 is charged to the voltage at input terminal 34. When he relay contact subsequently opens, capacitor 32 holds this voltage until the relay contact closes again. Amplifier 31 provides an output voltage at output terminal 35 which is equal to the voltage stored on capacitor 32. Capacitor 32 will not discharge because of the high input impedance of amplifier 31.

Figure 3:
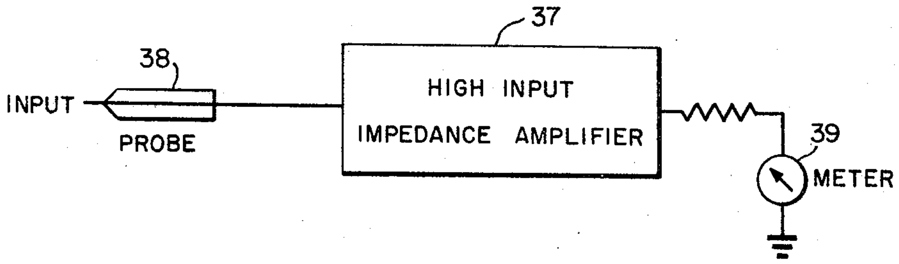
FIG. 3 is a partially schematic and partially block diagram illustrating the use of the invention as an electronic voltmeter.

FIG. 3 illustrates the use of the amplifier according to the invention as an electronic voltmeter. In this case the input of amplifier 37 is connected to a probe 38; and its output, to meter 39. Meter movements are current-sensitive devices and low impedance. Amplifier 37 provides the current for meter 39 while maintaining a high input impedance so that the probe 38 does not affect the operation of the circuit being tested.

Figure 4:
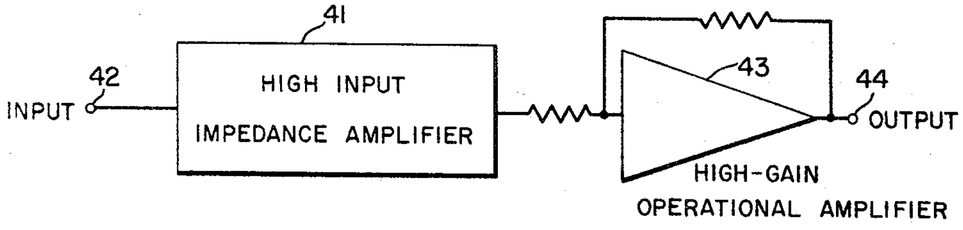
FIG. 4 is a partially schematic and partially block diagram illustrating the use of the invention in a high-impedance-gain amplifier.

Another use of the invention is illustrated in FIG. 4 where the high input impedance amplifier 41 is connected between the input terminal 42 and the input of an operational amplifier 43. As so connected, the effective input impedance of operational amplifier 43 is raised resulting in a very low dynamic output impedance at output terminal 44. The overall combination typically has an input impedance of greater than $10^{15}$ ohms and an output impedance of less than 0.1 ohm, giving an impedance transformation of greater than $10^{16}$.

It will be apparent that the embodiment shown is only exemplary and that various modification can be made in construction and arrangement within the scope of the invention as defined in the appended claims.

I claim as my invention:

1. A high input impedance, solid-state amplifier comprising an insulated-gate, field-effect transistor connected as a source follower;

a conventional transistor connected as an emitter follower in cascade with said insulated-gate, field effect transistor, and means connected in the load circuit of said insulated-gate, field-effect transistor for maintaining the current therethrough constant.

2. An amplifier as recited in claim 1 further comprising:

a Zener diode connected across said insulated-gate, field-effect transistor to maintain a constant voltage drop thereacross.

3. An amplifier as recited in claim 2 wherein said Zener diode is double-anode diode to provide temperature compensation against drift of the Zener diode.

4. An amplifier as recited in claim 2 further comprising:

means connected in the load circuit of said conventional transistor for maintaining the current therethrough constant.

5. An amplifier as recited in claim 4 wherein both said means connected in the load circuit of said insulated-gate, field-effect transistor and said means connected in the load circuit of said conventional transistor are temperature compensated against drift.

6. An amplifier as recited in claim 4 further comprising:

positive feedback means connected between said conventional transistor and said insulated-gate, field-effect transistor for maintaining the voltage gain of said amplifier at unity.

7. An amplifier as recited in claim 6 wherein the bias point of said insulated-gate, field-effect transistor is chosen so that the gate-to-source voltage approximately equals the drain-to-source voltage thereby making the output voltage of said amplifier equal to the input voltage with no D.C. offset.

References Cited

UNITED STATES PATENTS 3,187,267 6/1965 Merington ---------- 307—88.5

OTHER REFERENCES

Stokesberry, A Large Signal IGFET D.C. Source Follower, Proceedings of the IEEE, January 1966, p. 66.

Steele and Mendes, Analog Output for Direct Digital Control, IBM Technical Disclosure Bulletin, November 1965, p. 912.

ROY LAKE, *Primary Examiner.*

L. J. DAHL, *Assistant Examiner.*

U.S. Cl. X.R.

307—304, 318; 330—24